United States Patent

Hays

[11] Patent Number: 6,143,583
[45] Date of Patent: Nov. 7, 2000

[54] DISSOLVED WAFER FABRICATION PROCESS AND ASSOCIATED MICROELECTROMECHANICAL DEVICE HAVING A SUPPORT SUBSTRATE WITH SPACING MESAS

[75] Inventor: Ken Maxwell Hays, Santa Ana, Calif.

[73] Assignee: Honeywell, Inc., Morristown, N.J.

[21] Appl. No.: 09/093,492

[22] Filed: Jun. 8, 1998

[51] Int. Cl.[7] .................................................. H01L 21/00
[52] U.S. Cl. ................................ 438/39; 438/40; 438/43; 438/48; 438/50; 438/51; 438/53; 438/455; 438/456; 438/457; 438/458; 438/459; 438/107; 438/164
[58] Field of Search .................................. 438/39, 40, 43, 438/48, 50, 51, 52, 53, 455, 456, 457, 458, 459, 107, 164

[56] References Cited

U.S. PATENT DOCUMENTS

| | | | |
|---|---|---|---|
| 5,273,939 | 12/1993 | Becker et al. | 437/209 |
| 5,426,070 | 6/1995 | Shaw et al. | |
| 5,448,444 | 9/1995 | Provenzano et al. | |
| 5,572,029 | 11/1996 | Walker et al. | |
| 5,578,843 | 11/1996 | Garabedian et al. | |
| 5,650,568 | 7/1997 | Greiff et al. | |
| 5,668,033 | 9/1997 | Ohara et al. | 438/113 |
| 5,672,240 | 9/1997 | Stoner et al. | |
| 5,858,814 | 1/1999 | Goossen et al. | 438/107 |
| 5,930,651 | 7/1999 | Terasawa | 438/456 |

FOREIGN PATENT DOCUMENTS 0 820 104  1/1998  European Pat. Off. .

Primary Examiner—John F. Niebling
Assistant Examiner—Viktor Simkovic
Attorney, Agent, or Firm—Alston & Bird LLP

[57] ABSTRACT

The method of the present invention provides a process for manufacturing MEMS devices having more precisely defined mechanical and/or electromechanical members. The method of the present invention begins by providing a partially sacrificial substrate and a support substrate. In order to space the mechanical and/or electromechanical members of the resulting MEMS device above the support substrate, mesas are formed on the support substrate. By forming the mesas on the support substrate instead of the partially sacrificial substrate, the mechanical and/or electromechanical members can be more precisely formed from the partially sacrificial substrate since the inner surface of the partially sacrificial substrate is not etched and therefore remains planar. As such, trenches can be precisely etched through the planar inner surface of the partially sacrificial substrate to define mechanical and/or electromechanical members of the MEMS device. The present invention also provides an improved MEMS device, such as an improved gyroscope, that includes more precisely and reliably defined mechanical and/or electromechanical members.

15 Claims, 11 Drawing Sheets

DISSOLVED WAFER FABRICATION PROCESS AND ASSOCIATED MICROELECTROMECHANICAL DEVICE HAVING A SUPPORT SUBSTRATE WITH SPACING MESAS

FIELD OF THE INVENTION

The present invention relates to a microelectromechanical device and method for making the device. In particular, the invention relates to a microelectromechanical device having a support substrate that includes mesas for supporting the doped region of a partially sacrificial substrate which defines various mechanical and/or electromechanical members of the microelectromechanical device and a method for making the device.

BACKGROUND OF THE INVENTION

Traditionally, the miniaturization of mechanical and/or electromechanical systems has been frustrated by limitations on the manufacture of small lightweight mechanical or electromechanical parts. The intricacy of the parts made their manufacture on a small scale difficult and impractical. For instance, until recently, heavy and large gimbal systems were used for navigational guidance systems in the aerospace industry. These systems contained mechanical parts that were formed of metal and were generally large and heavy. However, the intricacy of the mechanical parts made miniaturization of the navigational guidance system difficult.

However, in recent years with the proliferation and increased precision in semiconductor fabrication procedures, many of the mechanical and electromechanical structures in a mechanical system may now be replaced by microelectromechanical structures (MEMS) that are fabricated by semiconductor fabrication techniques. For instance, some gimbal systems have been replaced by gyroscopes that include one or more MEMS devices. An example of these gyroscopes is described in U.S. Pat. No. 5,650,568 to Greiff et al., the contents of which are incorporated herein by reference.

The Greiff et al. '568 patent describes a gimballed vibrating wheel gyroscope for detecting rotational rates in inertial space. The typical gimbals of the traditional larger and heavier mechanical systems have been replaced by the lightweight, miniaturized MEMS devices. These MEMS devices that form the various mechanical and/or electromechanical parts of the gyroscope are fabricated with conventional semiconductor techniques. The electrical properties of the gyroscope are then used to provide power to these parts and to receive signals from the parts.

An important advantage in the use of MEMS devices for mechanical and electromechanical systems is the reduction of size and weight that can be achieved over the conventional mechanical systems that use metal parts. However, many mechanical and electromechanical systems, such as the gimballed systems described above, have many moving parts that must be accurately fabricated in order to operate properly with the requisite accuracy and precision. Thus, the ability to replace metallic parts with MEMS devices fabricated by semiconductor techniques is limited by the precision that can be achieved with the semiconductor fabrication techniques. Although current semiconductor fabrication techniques have been utilized to manufacture MEMS devices, these fabrication procedures still present several limitations as described below in conjunction with the Greiff et al. '568 patent.

In this regard, FIGS. 1A–1D illustrate a conventional method for manufacturing MEMS devices with conventional semiconductor fabrication techniques. The process illustrated in these figures is commonly known as a Dissolved Wafer Process (DWP) and is described in the Greiff et al. '568 patent.

In particular, with reference to FIG. 1A, a silicon substrate 10 and a support substrate 12 are shown. In a typical MEMS device, the silicon substrate is etched to form the mechanical and/or electromechanical members of the device. The mechanical and/or electromechanical members are generally supported above the support substrate such that the mechanical and/or electromechanical members have freedom of movement. This support substrate is typically made of an insulating material, such as Pyrex® glass.

As illustrated in FIG. 1A, support members 14 are initially etched from the inner surface of the silicon substrate. These support members are commonly known as mesas and are formed by etching, such as with potassium hydroxide (KOH), those portions of the inner surface of the silicon substrate that are exposed through an appropriately patterned layer of photoresist 16. Preferably, the etching is continued until mesas 14 of a sufficient height have been formed.

With reference to FIG. 1B, the etched inner surface 18 of the silicon substrate is thereafter doped, such as with boron, to provide a doped region 20 of a predetermined depth such that the silicon substrate 10 has both a doped region 20 and an undoped sacrificial region 22. Referring to FIG. 1C, trenches are then formed, such as by a reactive ion etching (RIE), that extend through the doped region 20 of the silicon substrate 10. These trenches form the mechanical and/or electromechanical members of the MEMS device.

As shown in FIGS. 1A–1C, the support substrate 12 is also initially etched and metal electrodes 26 and conductive traces (not shown), are formed on the inner surface of the support substrate. These electrodes and conductive traces will subsequently provide electrical connections to the various mechanical and/or electromechanical members of the MEMS device.

Once the support substrate 12 is processed to form the electrodes and conductive traces, the silicon substrate 10 and the support substrate 12 are bonded together. With reference to FIG. 1D, the silicon and support substrates are bonded together at contact surfaces 28 on the mesas 14, such as by an anodic bond. As a final step, the undoped sacrificial region 22 of the silicon substrate is etched away such that only the doped region that comprises the mechanical and/or electromechanical member of the resulting MEMS device remains. The mesas that extend outwardly from the silicon substrate therefore support the mechanical and/or electromechanical members above the support substrate such that the members have freedom of movement. Further, the electrodes formed by the support substrate provide an electrical connection to the mechanical and/or electromechanical members through the contact of the mesas with the electrodes.

As known to those skilled in the art, the step of reactive ion etching trenches through the doped region 20 of the silicon substrate 10 must be controlled to insure that the resulting trenches are accurately located on the inner surface of the partially sacrificial substrate and that the widths and walls of the trenches are formed with great precision. For example, the trenches formed by RIE must generally be formed to within a tolerance of 0.1 to 0.2 microns of a predetermined width. Further, it is important that the trenches extend completely through the doped region. As such, the inner surface of the silicon substrate must be planar and the doped region must have a predetermined thickness. While the silicon substrate 10 can be initially formed to have a planar inner surface, the inner surface of the silicon substrate is thereafter etched to form the mesas 14. Unfortunately, an etching process will produce a surface that is no longer planar, but which, instead, has a number of surface irregularities. Accordingly, because the surface is non-planar, the subsequent RIE step cannot produce trenches that are accurately located on the inner surface doped region of the partially sacrificial substrate nor can the walls of the trenches be etched with great precision. Further, the subsequent RIE step may not produce trenches that extend completely through the doped region or may produce trenches that extend too far into the undoped sacrificial region of the silicon substrate.

Thus, a method is needed for manufacturing MEMS devices utilizing semiconductor fabrication techniques that separate the various mechanical and/or electromechanical members by means of RIE through the planar inner surface of a silicon substrate such that the trenches formed by RIE extend completely through the doped region of the sacrificial silicon substrate and are precisely located on the inner surface of the doped region of the silicon substrate and have precisely defined walls. Further, a method is needed for manufacturing a gimballed vibrating wheel gyroscope for detecting rotational rates in inertial space, where the mechanical and/or electromechanical parts of the gyroscope are manufactured with increased precision.

SUMMARY OF THE INVENTION

As set forth below, the method for forming a MEMS device and the associated MEMS device of the present invention overcome the deficiencies identified with conventional methods. In particular, the method of the present invention separates the various mechanical and/or electromechanical members of the MEMS device by etching, such as by RIE, through the inner surface of a partially sacrificial substrate that is planar such that the resulting trenches are precisely defined in terms of dimension, position and depth. In particular, for a MEMS device constructed primarily from the doped region of a partially sacrificial substrate and a support substrate, the method of the present invention etches the support mesas from the support substrate instead of the partially sacrificial substrate. By etching the mesas from the support substrate rather than the inner surface of the partially sacrificial substrate, the inner surface of the partially sacrificial substrate remains planar for the etching procedures that separate the precise mechanical and/or electromechanical members. As such, MEMS devices having mechanical and/or electromechanical members can be reliably produced.

Further, the present invention provides a MEMS device that includes a support substrate having mesas that extend outwardly therefrom. The MEMS device of the present invention also includes a partially sacrificial substrate from which the mechanical and/or electromechanical members are formed that is supported by the mesas. Because the mesas are formed from the support substrate as opposed to the partially sacrificial substrate, the inner surface of the partially sacrificial substrate remains planar for later etching to separate the mechanical and/or electromechanical members.

These and other advantages are provided, according to the present invention, by a method for forming a MEMS device that initially provides a partially sacrificial substrate having a planar inner surface. The partially sacrificial substrate is doped such that the partially sacrificial substrate includes both a doped region and an undoped sacrificial region, wherein the doped region is adjacent to the inner surface of the partially sacrificial substrate. The method of the present invention also provides a support substrate, typically formed of a dielectric material, for supporting the partially sacrificial substrate. To suspend the partially sacrificial substrate above the support substrate the method of the present invention includes the step of forming at least one mesa on the support substrate, such that the mesa extends outwardly from the remainder of the inner surface of the support substrate.

The method of the present invention further includes the step of bonding the inner surface of the partially sacrificial substrate to the mesa such that the partially sacrificial substrate is suspended above the remainder of the support substrate and the doped region of the partially sacrificial substrate is in a facing relationship with the support substrate. By forming the mesas on the support substrates, the inner surface of the partially sacrificial substrate remains planar to facilitate forming the mechanical and/or electromechanical members of the MEMS device.

The method of the present invention preferably further includes the step of dissolving or otherwise removing the undoped sacrificial region of the partially sacrificial substrate after the partially sacrificial substrate has been bonded to the mesas of the support substrate. By removing the undoped region of the partially sacrificial substrate, the mechanical and/or electromechanical members formed from the doped region of the partially sacrificial substrate have freedom to move. Further, the removal of the undoped sacrificial region of the partially sacrificial substrate reduces the retention of heat by the resulting MEMS device.

Another important aspect of the present invention is the establishment of appropriate electrical connections with the mechanical and/or electromechanical members of the MEMS device. To facilitate these connections, the method of the present invention includes the step of depositing a conductive material on at least a portion of the surface of the mesa to thereby form an electrode that is in electrical communication with the doped region of the partially sacrificial substrate once the partially sacrificial substrate and the support substrate have been bonded. The electrodes can then establish an electrical connection with the mechanical and/or electromechanical members of the MEMS device.

According to one advantageous embodiment, the method of the present invention includes the step of forming at least one mesa that has a contact surface extending between a set of sloped sidewalls. As such, the conductive material can be deposited on at least a portion of the contact surface and at least one sloped sidewall of the mesa. Because the sidewalls of the mesa are sloped, the metallic material can be more readily deposited on the mesa.

In a further embodiment of the method of the present invention, the mesa having sloped sidewalls is formed by applying a photoresist layer on the surface of the support substrate at locations corresponding to the predetermined locations of the mesas. The photoresist layer is preferably dimensionally sized to approximate the dimensions of the respective bases of the mesas. The method of this embodiment further includes the step of etching the exposed surface of the support substrate while simultaneously gradually reducing the dimensional size of the photoresist layer such that the resulting mesa has a contact surface extending between a set of sloped sidewalls. Since the photoresist layer shrinks during the etching process, the contact surface of each mesa is smaller than the corresponding base.

The present invention also provides a MEMS device having precisely defined mechanical and/or electromechanical members. The MEMS device of this embodiment includes a semiconductive substrate that has an inner surface. The MEMS device of the present invention further includes a support substrate, typically formed of dielectric material, having at least one outwardly extending mesa for supporting the semiconductive substrate. Each mesa includes a contact surface that supports the semiconductive substrate such that the semiconductive substrate is suspended above the remainder of the support substrate. Because the mesas extend outwardly from the support substrate and are thus, not etched from on the semiconductive substrate, the MEMS device can include mechanical and/or electromechanical members that are precisely defined.

The mesas of the MEMS device can include a contact surface that extends between two sloped sidewalls. In addition, the MEMS device of this embodiment can also include an electrode that is formed on both the contact surface and at least one sloped sidewall of the mesa since the sloped sidewalls allow the metallic material which forms the electrodes and traces to be more easily deposited.

Accordingly, the fabrication method and associated MEMS device of the present invention provide mesas that are etched from the support substrate. By etching the mesas from the support substrate, the inner surface of the partially sacrificial substrate remains planar such that the mechanical and/or electromechanical members of the resulting MEMS device may be formed from the partially sacrificial substrate with greater precision and reliability.

DETAILED DESCRIPTION OF THE PREFERRED EMBODIMENT

Figure 1A:
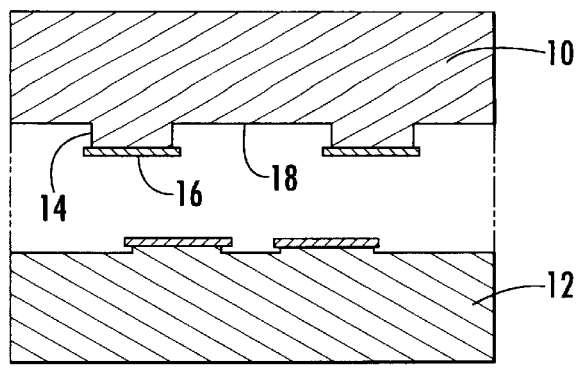
FIGS. 1A–1D are sequential cross-sectional views of a conventional method for forming a MEMS device.
Figure 1B:
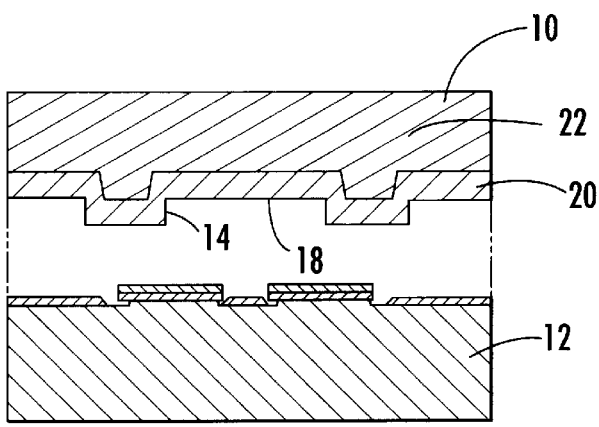
Figure 1C:
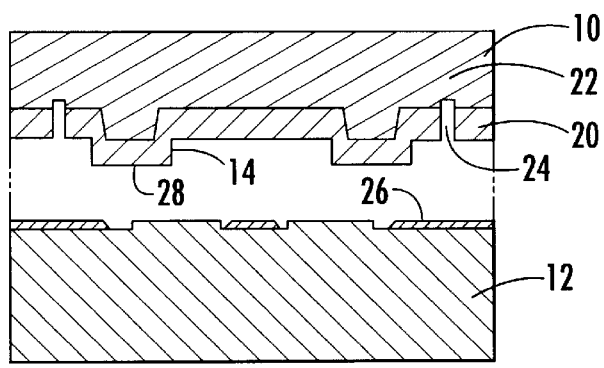
Figure 1D:
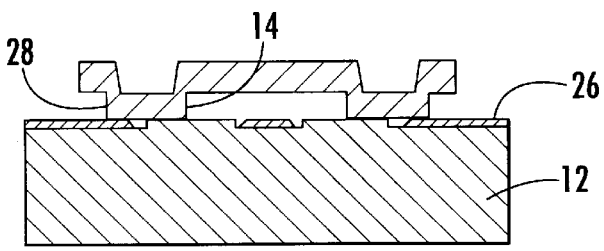

The present invention will now be described more fully hereinafter with reference to the accompanying drawings, in which a preferred embodiment of the invention is shown. This invention may, however, be embodied in many different forms and should not be construed as limited to the embodiments set forth therein; rather, this embodiment is provided so that this disclosure will be thorough and complete and will fully convey the scope of the invention to those skilled in the art. Like numbers refer to like elements throughout.

The method of the present invention fabricates unique MEMS devices having precisely defined mechanical and/or electromechanical members by maintaining the planar nature of the inner surface of the partially sacrificial substrate such that the mechanical and/or electromechanical members can be separated or otherwise formed in a precise and reliable fashion. FIGS. 2A–2F illustrate an advantageous embodiment of the method and device of the operations performed to fabricate MEMS devices according to the present invention. With reference to FIGS. 2A–2F and the block diagram of FIG. 3, the fabrication method of the present invention includes the step of providing a partially sacrificial substrate 30 having inner and outer surfaces 30a, 30b. (See step S100). In the preferred embodiment, the partially sacrificial substrate is silicon, however, this partially sacrificial substrate can be of any particular material that can be doped to form a doped region such as a gallium arsenide, germanium, etc.

The method of the present invention further comprises the step of doping (step S120) a portion of the partially sacrificial substrate such that the partially sacrificial substrate includes both a doped region 32, adjacent the inner surface 30a, and an undoped sacrificial region 34, adjacent the outer surface 30b. The partially sacrificial substrate is doped with a dopant to a predetermined depth relative to the inner surface, such as 10 microns.

In a preferred embodiment, the dopant is introduced into the partially sacrificial substrate by a diffusion method as commonly known in the art. However, the method of the present invention is not limited to this technique and thus, the doped region adjacent to the inner surface of the partially sacrificial substrate may be formed by any method known in the art. Further, in the illustrative embodiment, the partially sacrificial substrate is doped with a boron dopant, however, the dopant may consist of any type dopant that forms a doped region within the partially sacrificial substrate.

Figure 2A:
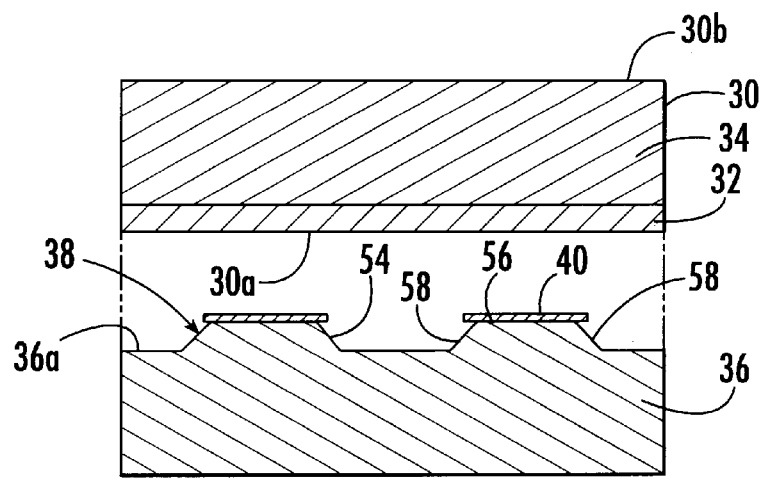
FIGS. 2A–2F are sequential cross-sectional views illustrating the operations performed to form a MEMS device according to one embodiment of the present invention.
Figure 3:
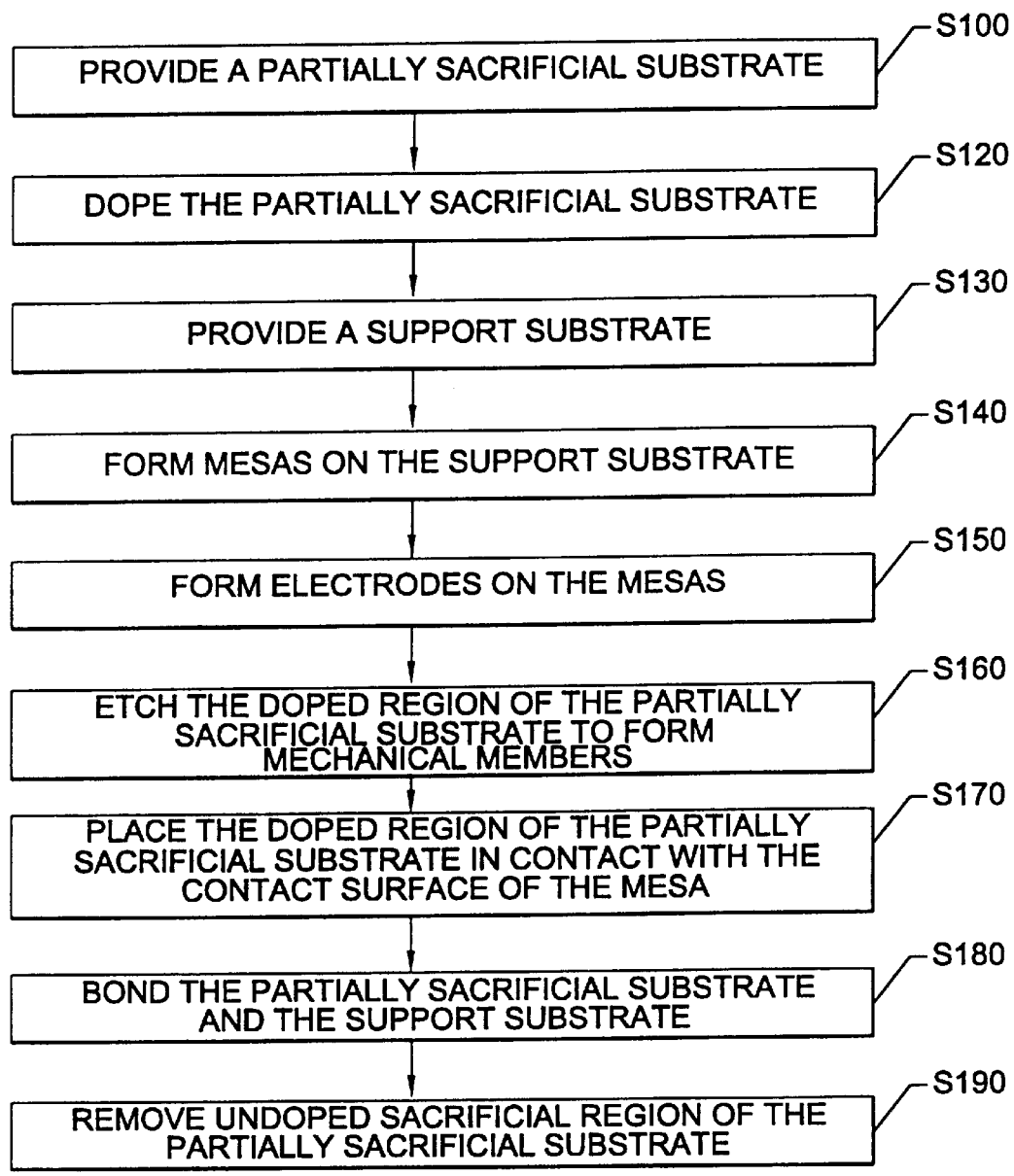
FIG. 3 is a block diagram of the operations performed to manufacture a MEMS device according to one embodiment of the present invention.

With reference to FIGS. 2A and 3, the method of the present invention also includes the step of providing a support substrate 36. (See step S130). In the preferred embodiment, the support substrate is formed of a dielectric material, such as a Pyrex® glass, such that the support substrate also electrically insulates the MEMS device. However, it is understood that the support substrate may be formed of any desired material, including a semiconductor material.

Figure 4:
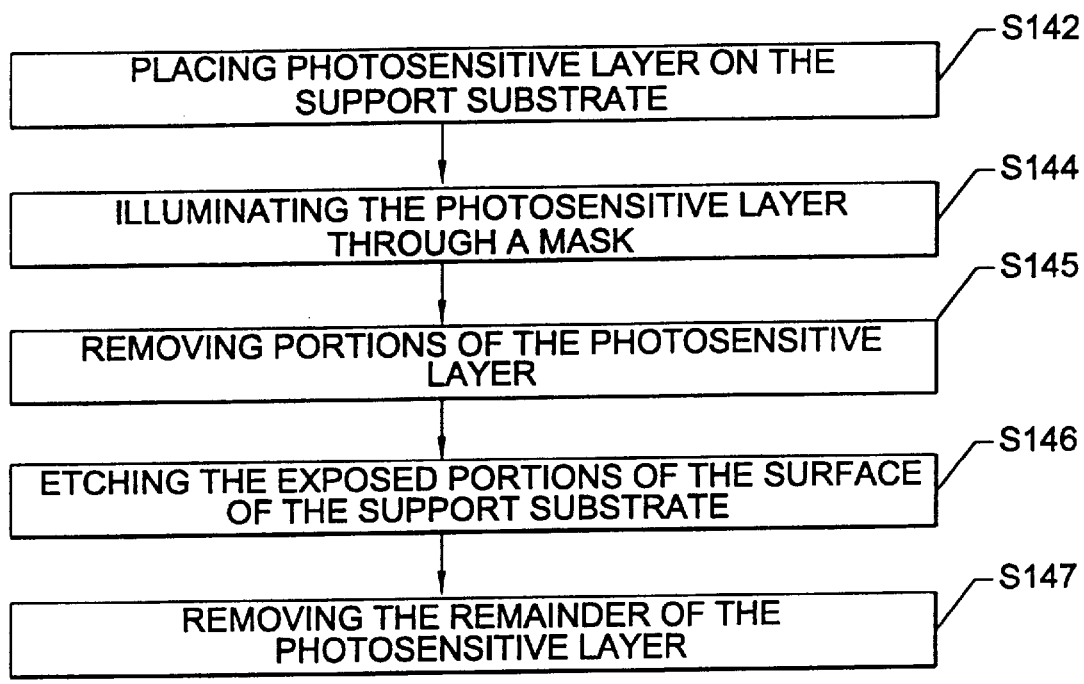
FIG. 4 is a block diagram of the operations performed to form mesas on a support substrate according to one embodiment of the present invention.

Also, with reference to FIGS. 2A and 3, the method of the present invention includes the step of etching sections of the support substrate such that mesas 38 are formed that extend outwardly from the inner surface 36a of the support substrate 36. (See step S140). With reference to FIGS. 2A and 4, the mesas are formed by first placing a photosensitive layer or film (not shown) on the inner surface of the support substrate. As known to those skilled in the art, the photosensitive film is commonly referred to as photoresist. (See step S142). Thereafter, the photosensitive film is at least partially covered by a mask and the exposed portions of the photoresistive film illuminated. (See step S144). In this regard, although the photosensitive film is typically illuminated with a UV light source, the photosensitive film can be illuminated with any particular light source capable of exposing the photosensitive film.

After portions of the photosensitive material have been exposed to light, portions of the photosensitive film are removed by exposing the photosensitive film to a developer solution, such as Shipley® developer concentrate. (See step S145). As known to those skilled in the art, either the portions of the photosensitive film that were exposed to the light or the portions of the photosensitive film that were not exposed to the light will be removed depending upon whether a positive or a negative photosensitive film is utilized, respectively. The portions of the support substrate that are not covered by the remaining photosensitive film are then etched, such as with reactive ion etching (RIE). (See step S146). The etching process continues until the portions of the support substrate surrounding the mesas 38 have been removed such that the mesas have the desired height. Thereafter, the remaining portions of the photosensitive layer are removed. (See step S147).

Figure 2B:
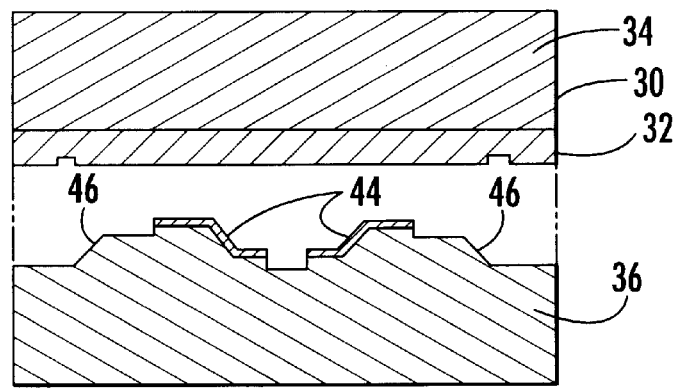
Figure 2C:
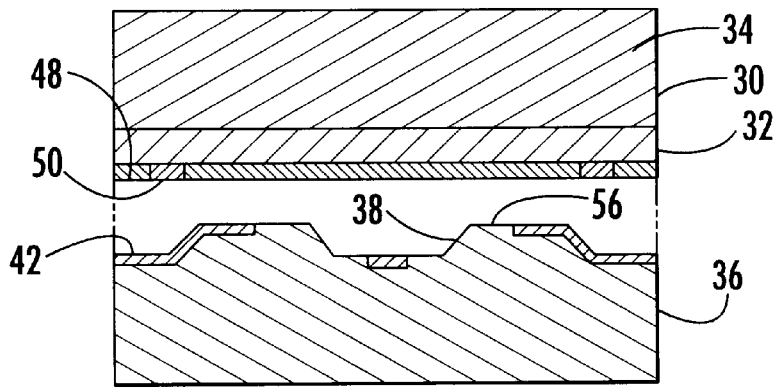
Figure 5:
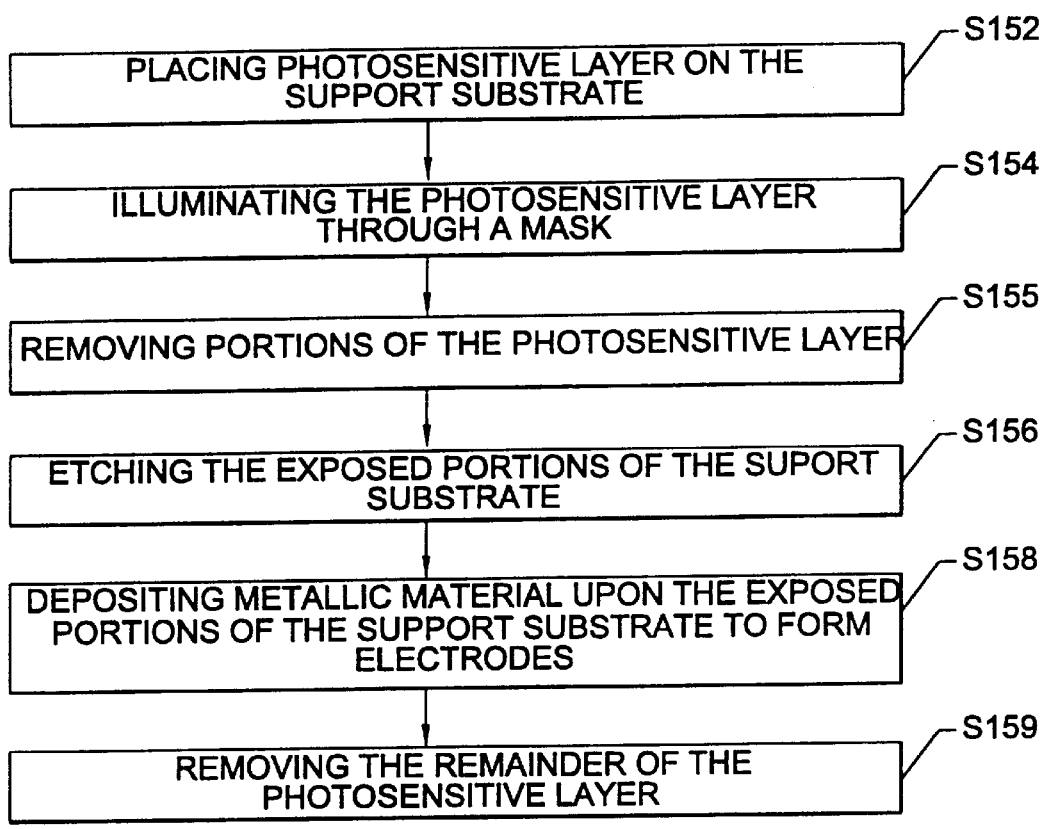
FIG. 5 is a block diagram of the operations performed to form electrodes on the support substrate according to one embodiment of the present invention.

With reference to FIGS. 2B, 2C, and 3, after the mesas 38 have been formed on the support substrate, the method of the present invention further includes the step of depositing a metallic material on the inner surface 36a of the support substrate 36 and, more particularly, on the mesas 38 to form electrodes 42. (See step S150). To prevent the metal deposited upon the mesas from extending too far above the surface of the mesas, however, the mesas are first selectively etched to define recessed regions in which the metal may be deposited. With reference to FIGS. 2B, 2C, and 5, the step of forming electrodes on the mesa 38 includes the step of placing photosensitive material (not shown) on the inner surface 36a of the support substrate 36 and patterning the photosensitive material such that the photosensitive material only covers those regions of the inner surface 36a upon which metal is not to be deposited. In other words, those portions of the inner surface of the support substrate that are to be etched and thereafter coated with a metal are not covered by the patterned photosensitive material and are therefore exposed. (See steps S152, S154 and S155). The method of the present invention further includes the step of etching the exposed portions of the inner surface of the support substrate, such as by means of BOE, to form recessed regions 46 in the predefined pattern. (See step S156).

With reference to FIGS. 2C and 5, the method of the present invention further includes the step of depositing metallic material in the etched recesses 46 to form electrodes 42 and conductive traces (not shown). (See step S158). As known in the art, the electrodes and traces may be comprised of any conductive material, such as a multilayered deposition of titanium, platinum, and gold and may be deposited by any suitable technique, such as sputtering. Thereafter, the remaining portions of the photosensitive layer are removed. (See step S159).

With reference to FIGS. 2C and 3, the inner surface of the partially sacrificial substrate is also etched to separate or otherwise form the mechanical and/or electromechanical members of the resulting MEMS device. (See step S160). As stated previously, the procedure for forming the mechanical and/or electromechanical members requires tight tolerances such that members having precise dimensions can be reliably formed. In particular, since the mesas are formed on the support substrate instead of the inner surface of the partially sacrificial substrate, at least those portions of the inner surface of the partially sacrificial substrate that will be subsequently etched to form the mechanical and/or electromechanical members are planar so as to facilitate the precise formation of the mechanical and/or electromechanical members.

Figure 2D:
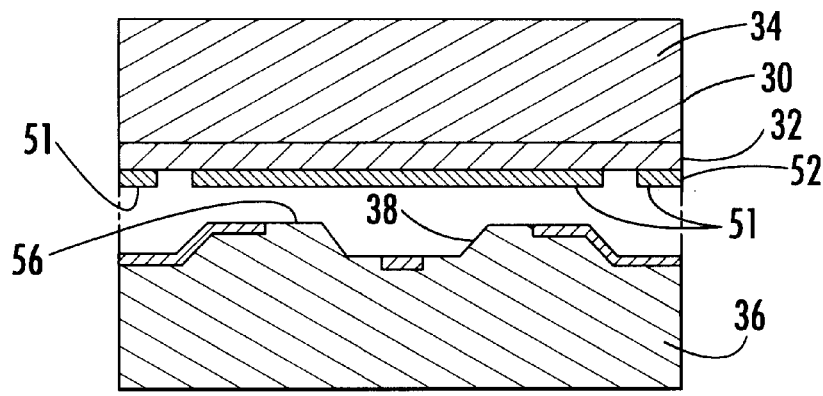
Figure 6:
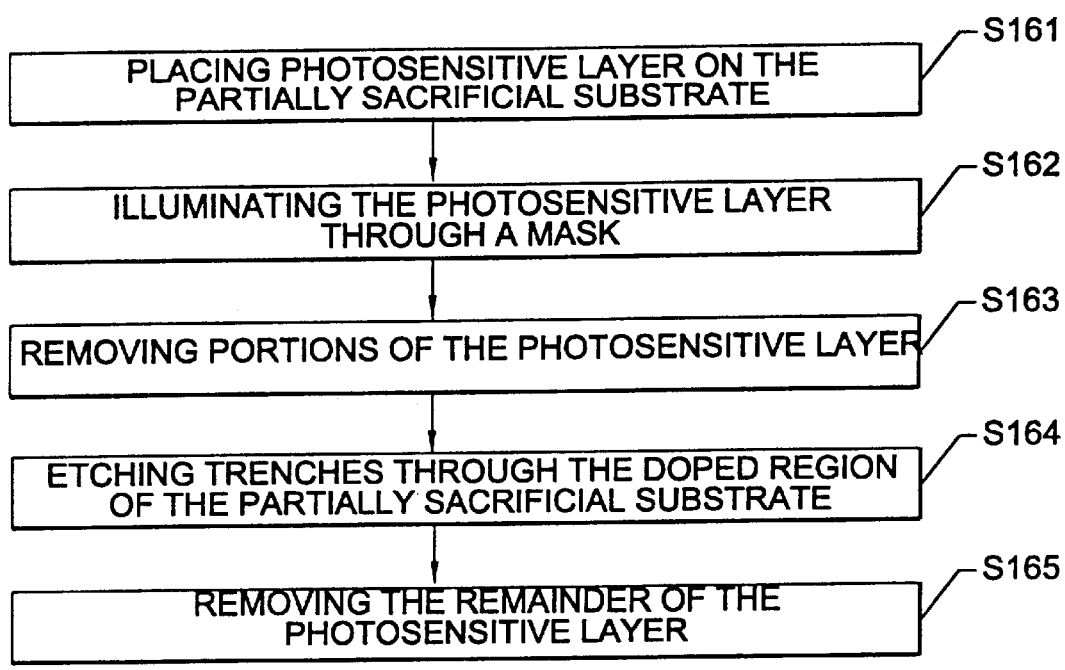
FIG. 6 is a block diagram of the operations performed to form mechanical and/or electromechanical members of a MEMS device from the doped region of a partially sacrificial substrate according to one embodiment of the present invention.

In detail, with reference to FIGS. 2C, 2D and 6, the mechanical and/or electromechanical members are formed by initially coating the inner surface of the partially sacrificial substrate with a photosensitive layer 48. (See step S161). After covering the photosensitive layer with a mask that defines the regions to eventually be etched, the exposed portions of the photosensitive layer are illuminated. (See step S162). After removing the mask, portions of the photosensitive layer 50 are removed such that the remaining portion 51 of the photosensitive layer does not cover those regions of the inner surface of the partially sacrificial substrate which will eventually be etched. (See step S163).

Figure 2E:
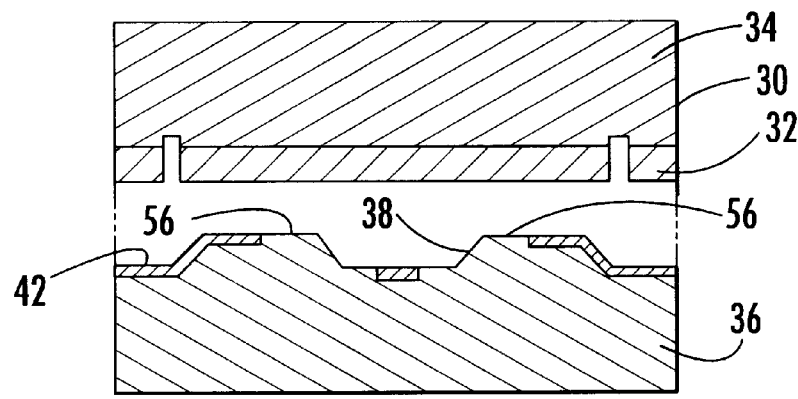

With reference to FIG. 2E, the exposed portions of the inner surface of the partially sacrificial substrate are then etched, such as by RIE etching, to form trenches through the doped region of the partially sacrificial substrate. (See step S164). As described below, the doped region of the partially sacrificial substrate that extends between the trenches will form the resulting mechanical and/or electromechanical member(s) of the MEMS device. After the mechanical and/or electromechanical members of the MEMS device have been defined by the etched trenches, the method of the present invention removes the remaining photosensitive material 51 from the inner surface of the partially sacrificial substrate. (See step 165).

Figure 2F:
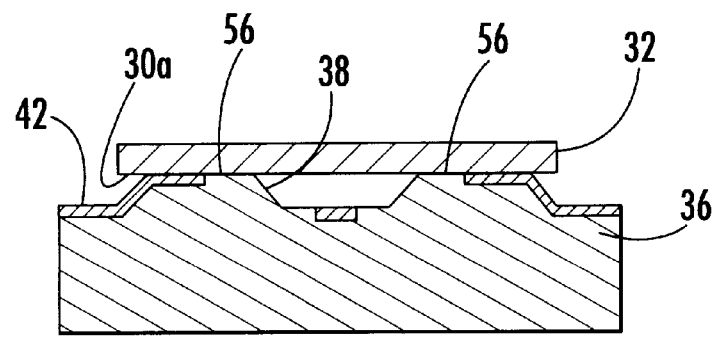

With reference to FIGS. 2F and 3, the method of the present invention also includes the step of placing the inner surface of the partially sacrificial substrate in contact with the mesas, including the electrodes deposited on the surface of the mesas. (See step S170). A bond is then formed between the partially sacrificial substrate and the mesas. (See step S180). In a preferred embodiment, the bond is an anodic bond, however, it is understood that the bond could be of any type that provides for a secure engagement.

It is also oftentimes advantageous to remove the undoped sacrificial region of the partially sacrificial substrate such that the mechanical and/or electromechanical members can rotate, move, and flex. This technique is commonly referred to as a dissolved wafer process (DWP). Thus, in one embodiment, the method of the present invention further includes the step of removing the undoped sacrificial region of the partially sacrificial substrate. (See step S190). The removal of the undoped sacrificial region is typically performed by etching away the undoped sacrificial region such as with an ethylenediamine pyrocatechol (EDP) etching process, however, any doping-selective etching procedure may be used.

As stated above, the removal of the undoped sacrificial region of the partially sacrificial substrate provides several advantages. For instance, the removal of this material allows the mechanical and/or electromechanical members etched from the doped region to have freedom of movement so as to move or flex in relation to the support substrate. In addition, the removal of the undoped sacrificial region of the partially sacrificial substrate also disconnects the mechanical and/or electromechanical members from the remainder of the doped region of the partially sacrificial substrate outside of the trenches etched through the doped region.

With reference to FIG. 2A, it is oftentimes advantageous to provide mesas 38 that have a contact surface 56 that extends between a set of sloped sidewalls 58. These sloped sidewalls 58 allow the metal to be deposited on both the contact surface and at least one sidewall of the mesa by "stepping" metal up the sidewall to the contact surface.

It is important to note that the mesas may assume any geometric form. For instance, in this embodiment, the mesas are formed in a frusto pyramidal shape, however, the cross-sectional shape of the mesas may also assume other forms such as octagonal, cylindrical, etc. as needed for the particular application. Further, it is understood that although the sloped sidewalls are referred to as a set of sloped sidewalls, only one of the sidewalls of the set may be sloped in some applications.

Figure 7:
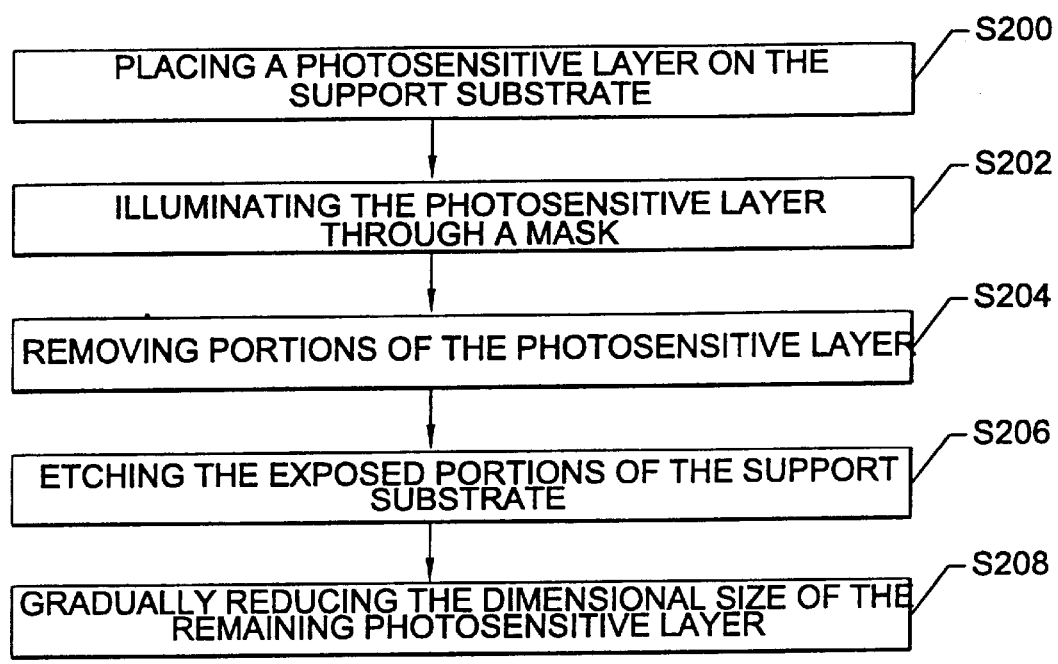
FIG. 7 is a block diagram of the operations performed to form mesas having sloped sidewalls on the support substrate according to one embodiment of the present invention.

With reference to FIG. 7 which illustrates the operations required to create mesas with sloped sidewalls, the method of this embodiment of the present invention includes the step of applying a photosensitive layer to the inner surface of the support substrate that is patterned to only cover those locations that correspond to the eventual locations of the mesas. (See steps S200, S202 and S204). Thus, the photosensitive layer is formed of a number of pads, each of which will define a respective mesa. Each pad is dimensionally sized to approximate the dimensions of the base of the respective mesa. The method of the present invention further includes the step of etching the exposed inner surface of the support substrate. (See step S206). As the etching step is performed, the etchant also etches the photosensitive layer, thereby gradually reducing the dimensional size of various parts of the photoresist. (See step S208). As shown in FIG. 2A, this gradual reduction in the size of the pads creates mesas 38, each of which has a set of sloped sidewalls 58 and a contact surface 40 extending therebetween. As shown, the contact surface 40 has a smaller dimensional size than the base 54 of the mesa.

In addition to a method for making MEMS devices, the present invention is also directed to the resulting MEMS device, as shown in FIG. 2F for example. As described above in conjunction with the method, the resulting MEMS device of the present invention includes a semiconductive substrate 30 that includes a first inner surface 30a. As discussed earlier, the semiconductive substrate can be formed of silicon, gallium arsenide, germanium or the like that has a doped region 32 adjacent to the first inner surface 30a. The doped region of the semiconductive substrate forms the mechanical members of the MEMS device. Further, the doped region is typically doped with boron, however, the region may be doped with other dopants such as indium, thallium, and aluminum.

The MEMS device of this embodiment of the present invention further includes a support substrate 36. The support substrate serves to suspend the semiconductive substrate, such that the mechanical and/or electromechanical parts defined by the semiconductive substrate have increased freedom of movement or flex. However, the support substrate can also perform other functions, such as by serving as an electrical insulator or a heat sink for the mechanical and/or electromechanical parts of the MEMS device. As such, the support substrate is typically formed of a dielectric material, such as Pyrex® glass.

The MEMS device of the present invention and, more particularly, the support substrate further includes at least one mesa 38. This mesa extends outwardly from the remainder of the support substrate 36 and serves to support the semiconductive substrate 36. As discussed previously, because the mesas 38 are formed on the support substrate as opposed to the semiconductive substrate, the inner surface of the semiconductive substrate remains highly planar to facilitate precise and controlled etching of the trenches through the doped region of the semiconductive substrate. As described above, the mesa includes a contact surface 56 that supports the inner surface 30a of the semiconductive substrate such that the semiconductive substrate is suspended over the remainder of the support substrate 38.

In one embodiment of the MEMS device of the present invention, electrodes 42 are formed on the mesa 38 to provide an electrical connection to the mechanical and/or electromechanical members of the MEMS device. In a preferred embodiment of the present invention, the mesa includes a contact surface 56 that extends between a set of sloped sidewalls 58. In this embodiment, the electrodes are deposited on both the contact surface 56 and at least one of the sloped sidewalls 58 of the mesa. The resulting electrodes are therefore exposed on the sidewalls of the respective mesas to facilitate electrical contact therewith.

As described above, the contact surface 56 of the mesa supports the inner surface 30a of the semiconductive substrate. In some embodiments, the contact surface of the mesas and the inner surface of the semiconductive substrate are bonded or otherwise joined. For example, the contact surfaces of the mesas and the inner surface of the semiconductive substrate can be bonded by an anodic bond or the like.

As discussed previously, MEMS devices are used in a wide variety of applications. One application in particular is a gimballed vibrating wheel gyroscope such as described in U.S. Pat. No. 5,650,568 to Greiff et al. As described in the Greiff et al. patent, and illustrated in FIG. 8, the gyroscope includes a plurality of mechanical and/or electromechanical members that are etched from a semiconductive substrate. These members generally include a wheel assembly, or rotor 62, a stator 64, and a plurality of drive electrodes 66a–h that terminate at a plurality of finger-like members 68. According to the present invention and unlike the Greiff et al. patent, these members are supported over a support substrate (not shown), by a plurality of mesas 70a–h that extend outward from the support substrate.

Figure 8:
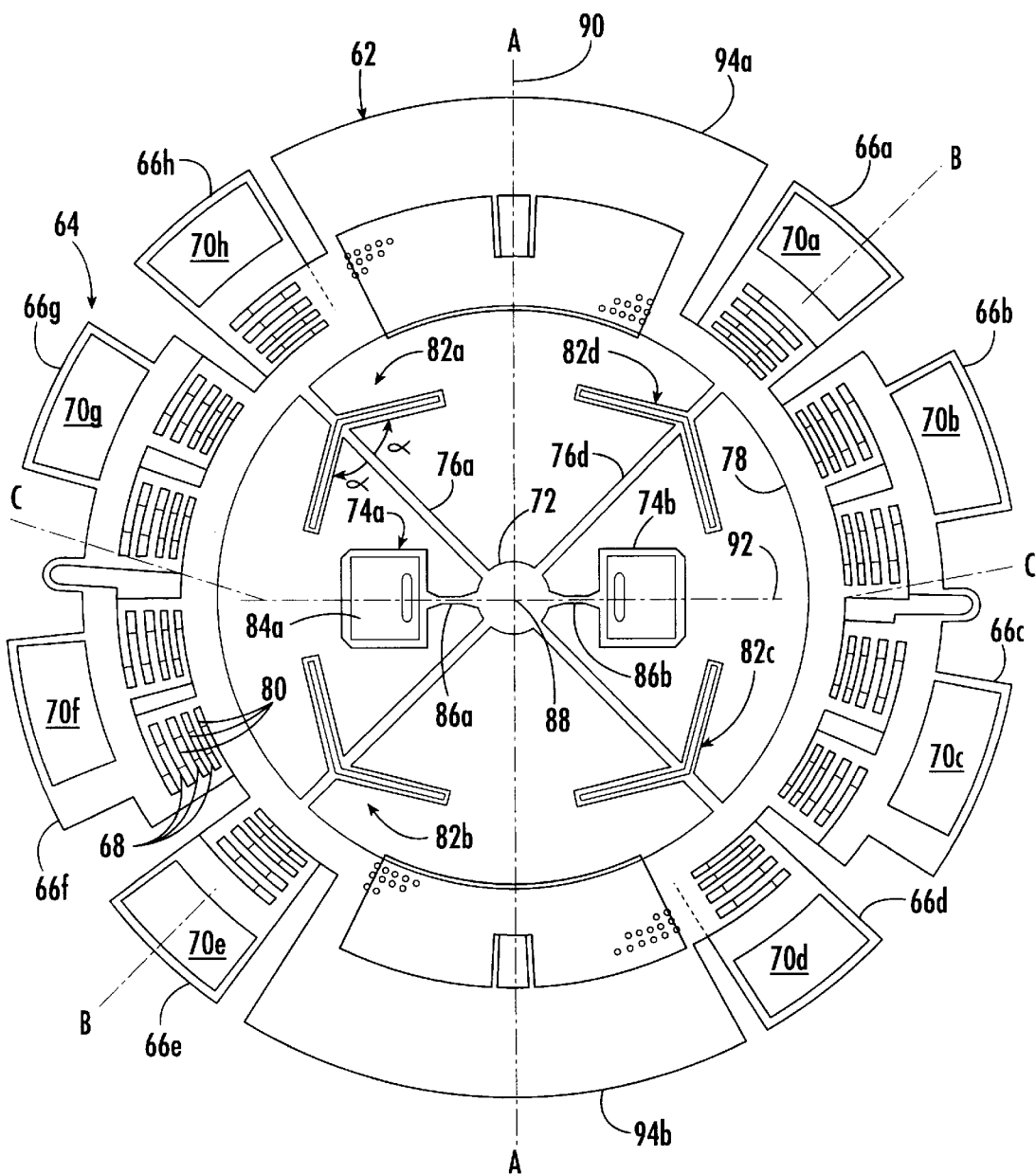
FIG. 8 is a plan view of a vibrating wheel gyroscope according to one embodiment of the present invention.

As shown in FIG. 8, the rotor 62 includes a central hub 72, suspended over the support substrate by a pair of post assemblies 74a and 74b, a plurality of spokes 76a–d and an outer wheel or rim 78 from which a plurality of finger-like members 80 extend. The finger-like members 80 of the rotor are interleaved with the finger-like members 68 of the stator 64 for electrostatic actuation by the stator 64. Each of the spokes 74a–b includes a respective box-shaped strain relief portion 82a–d.

Each of the post assemblies 74a and 74b includes a respective support post 84a and 84b and post flexure 86a and 86b, referred to alternatively as output flexures 86a and 86b. A drive circuit (not shown) is also coupled to the stator drive electrodes 66a–h.

Upon energization of the drive electrodes 66a–h, the rim 78 of the wheel assembly 62 vibrates, or oscillates rotationally in the plane of the assembly about a drive axis 88. The gyroscope may be operated in a self-oscillatory manner or, alternatively, may be operated open loop. When the wheel rim 78 is vibrating rotationally, variations in the rotational rate of the vehicle upon which the gyroscope is mounted relative to an input axis 90 will cause the rim of the wheel assembly to deflect out of the plane of the gyroscope about the output axis 92.

A plurality of sense regions 94a, 94b extend from the rim 78 of the wheel assembly 62 along the input axis 90. Sense electrodes 94a, 94b are disposed on the support substrate and below respective sense regions 94a, 94b for sensing the out-of-plane deflection of the assembly 62.

As described in the Greiff patent, these gyroscopes are typically constructed using a dissolved wafer process (DWP) as discussed below. However, it must be understood that any microelectromechanical manufacturing process may be used to manufacture the improved gyroscope of the present invention.

Figure 9:
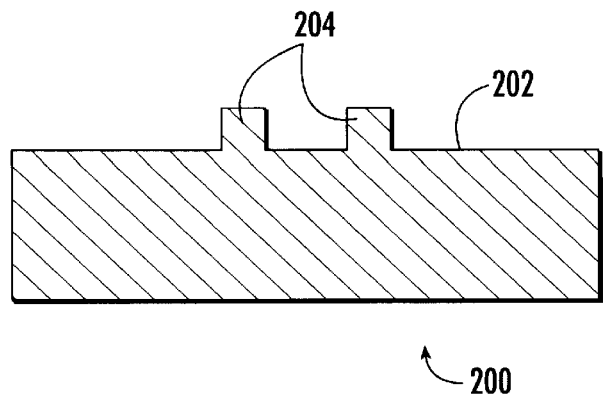
FIGS. 9–14 are cross-sectional views of the gyroscope of FIG. 8 at various stages of fabrication in accordance with one embodiment of the invention.

Referring initially to FIG. 9, a support substrate 200 is provided having a thickness of approximately 750 microns. In one embodiment, the support substrate 200 is comprised of glass, such as PYREX® glass. The support substrate has an inner or top surface 202, which is patterned and etched according to a conventional photolithographic process, as described above, to provide mesas 204 which support other portions of the gyroscope.

Figure 10:
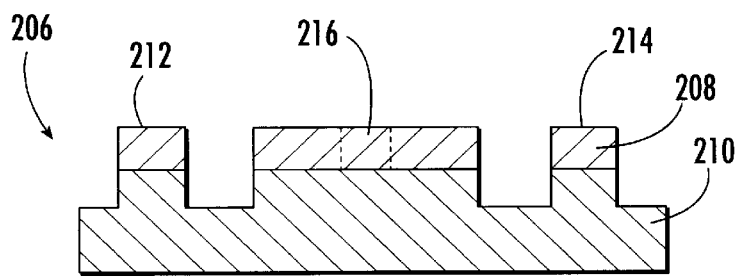

Referring now to FIG. 10, a semiconductive substrate 206 having a thickness on the order of 500 microns is initially doped to a predetermined depth, such as to approximately ten microns, to provide a doped region 208 and an undoped sacrificial region 210. In the illustrative embodiment, region 208 is doped with boron. This boron doped region 208 will eventually form the wheel assembly 62 of the gyroscope.

Figure 11:
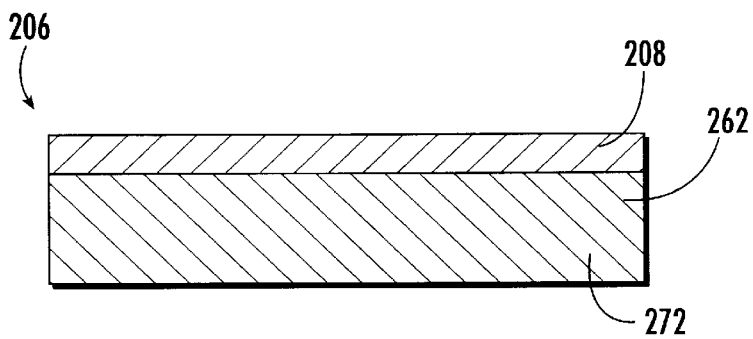

Referring to FIG. 11, the semiconductive substrate is thereafter patterned and etched, such as by RIE etching, to define the wheel assembly 62 in accordance with requirements of the particular application. In the illustrative embodiment, the etching of the semiconductive substrate FIG. 10 forms regions 212 and 214 which provide portions of the outer rim 78 along axis C (see FIG. 8) and further separates a central portion from the spaced regions 212 and 214, as shown. The portion 216 of doped region 208 between regions 212 and 214 forms the central hub 72 (See FIG. 8) and the output flexures 86a and 86b of the gyroscope.

Figure 12:
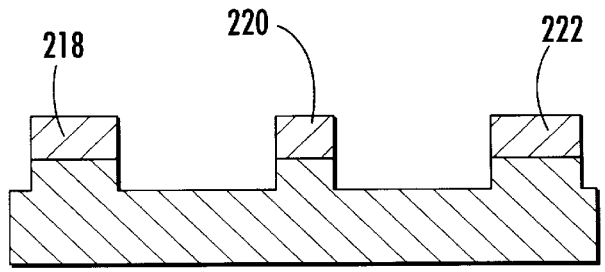

Referring now to FIGS. 11 and 12, a cross-section of the gyroscope taken along input axis A (FIG. 8) is shown following the above-described fabrication steps. More specifically, in FIG. 11, the semiconductive substrate 206 is shown to also have a boron doped region 208. Note that this cross-section of gyroscope along axis A does not cut through any regions similar to regions 212 and 214 of FIG. 10.

The RIE etching by which the structure of FIG. 10 is formed further forms three regions 218, 220, and 222 along axis A, as shown in FIG. 12. Central region 220 forms the central hub 72, see FIG. 8, and spaced regions 218 and 222 form portions of the outer rim 78 of the wheel assembly 62.

Figure 13:
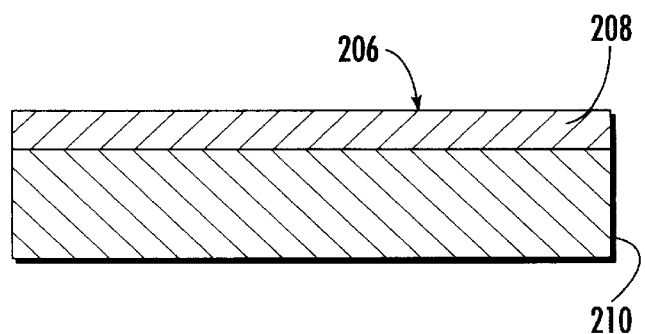
Figure 14:
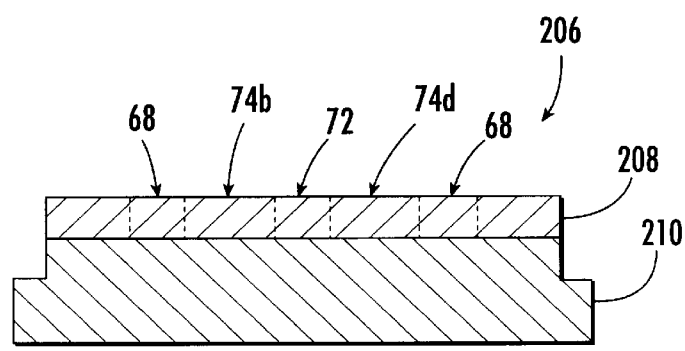

Referring also to FIG. 13, a cross-section of the gyroscope along axis B (FIG. 8) is shown. The RIE etching by which the structure shown in FIGS. 10 and 12 is formed yields the structure of FIG. 13 along axis B. More particularly, the etching step cuts through the boron doped region 206, as shown. The remaining portions of the boron doped region 206 form spoke flexures 74b and 74d, central hub 72, and interleaved finger-like members 80 of the wheel assembly 62, as well as the finger-like members 68 of the stator 64.

Figure 15:
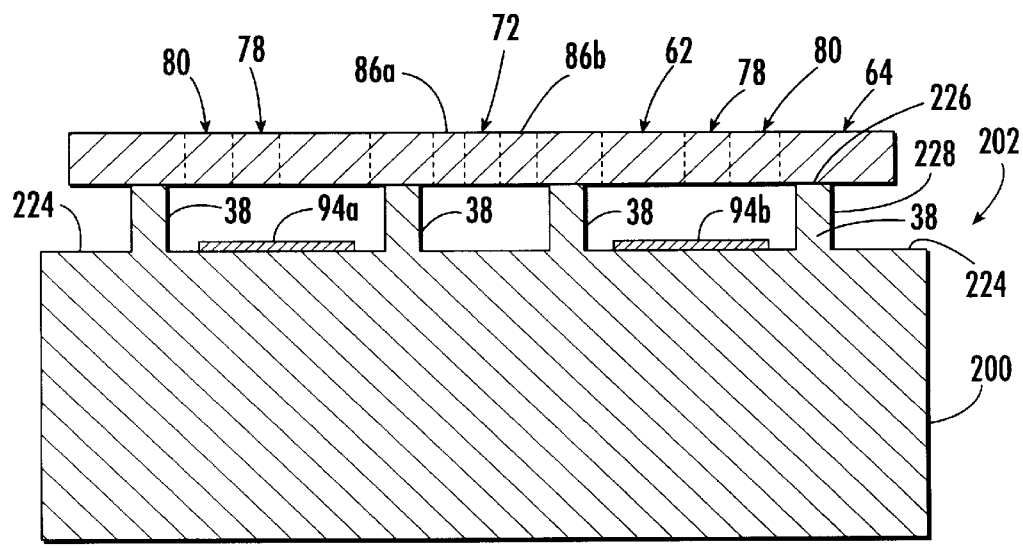
FIG. 15 is a partial cross-sectional view of the gyroscope of FIG. 8.

Referring to FIG. 15, a cross-sectional view of the complete gyroscope of FIG. 8 is shown taken along axis C. The sense electrodes 94a and 94b are formed over the top surface 202 of the support substrate 200. The sense electrodes 94a and 94b may be comprised of any suitable conductive material, such as a multilayered deposition of titanium, platinum, and gold, and may be deposited by any suitable technique, such as sputtering. Conductive traces 224 are also provided on a top surface 202 of the support substrate 200 so as to extend from a contact surface 226 on the mesas, down at least one sidewall 228 of the mesas to the edge portions of the support substrate 202. Further, traces 224 provide electrical connection to the drive electrodes 66a–h (not shown) for applying a drive signal to the drive electrodes.

Once the support substrate 200 is processed to form sense electrodes 94a and 94b and conductive traces 224, the wheel assembly structure as shown along different axes in the cross-sections of FIGS. 10–14 is bonded to the contact surface 226 of the mesas of the support substrate 200. More particularly, the semiconductive substrate is inverted and bonded to the support substrate 200 by anodic bonding. Although not shown, it will be appreciated that any undoped region 210 of the semiconductive substrate may be removed, such as by DWP. The wheel assembly 62 and stator 64 are thus suspended over the support substrate 200, as shown in FIG. 17, by means of the mesas extending outwardly from the top surface of the support substrate. Features of the wheel assembly 62 shown in the view of FIG. 17 include the central hub 72, output flexures 86a and 86b, outer rim 78, and rotor finger-like electrodes 80.

As discussed earlier, and shown in FIGS. 9 and 17, the gyroscope of the present invention includes mesas that are formed on the support substrate 200 as opposed to the semiconductive substrate 206. Because the mesas are etched from the support substrate, the inner surface of the semiconductive substrate remains planar prior to forming the trenches which define the mechanical and/or electromechanical members of the resulting gyroscope.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A method for forming a microelectromechanical structure, wherein said method comprises the steps of:

provided a partially sacrificial substrate having a first surface;

doping a portion of said partially sacrificial substrate with a dopant such that said partially sacrificial substrate includes a doped region and an undoped region, wherein the doped region is adjacent the first surface of said partially sacrificial substrate;

providing a support substrate for supporting said partially sacrificial substrate;

forming at least one mesa on a respective surface of said support substrate such that said at least one mesa extends outwardly from the respective surface; and bonding said first surface of said partially sacrificial substrate to said at least one mesa such that the first surface of said partially sacrificial substrate is suspended above the remainder of the respective surface of said support substrate with the doped region of said partially sacrificial substrate in a facing relationship thereto.

2. A method according to claim 1 further comprising the step of removing said undoped region of said partially sacrificial substrate following said bonding step.

3. A method according to claim 1 further comprising the step of depositing a conductive material on at least a portion of the surface of said mesa prior to said bonding step to form an electrode that will be disposed in electrical communication with the doped region of said partially sacrificial substrate following said bonding step.

4. A method according to claim 1, wherein said bonding step comprises the step of anodically bonding said doped first surface of said partially sacrificial substrate to said mesa of said support substrate.

5. A method according to claim 1, wherein said forming step comprises the step of forming at least one mesa having a contact surface extending between a set of sloped sidewalls, and wherein said method further comprises the step of depositing a conductive material on at least a portion of the contact surface and at least one of the sloped sidewalls of said mesa of said support substrate to form an electrode thereon prior to said bonding step.

6. A method according to claim 5, wherein said forming step comprises the steps of:
applying a photoresistive layer to said surface of said support substrate at a location corresponding to a predetermined location of said mesa, wherein said photoresistive layer is dimensionally sized to approximate the dimensions of a base of the mesa;
etching the exposed surface of said support substrate;
gradually reducing the dimensional size of the photoresistive layer during said etching step such that the resulting mesa comprises a contact surface extending between a set of sloped sidewalls and having dimensions smaller than the base of the mesa.

7. A method according to claim 1, wherein said doping step comprises the step of doping said substrate with a dopant selected from a group consisting of boron, indium, thallium and aluminum.

8. A method according to claim 1, wherein said providing step comprises the step of providing a partially sacrificial substrate selected from a group of substrates formed of silicon, germanium, and gallium arsenide.

9. A method according to claim 1, further comprising the step of providing a support substrate formed of a dielectric material.

10. A method for use in a dissolved wafer process for forming a micro-electromechanical device, wherein said method comprises the steps of:
providing a partially sacrificial substrate having a first surface;
doping a portion of said partially sacrificial substrate with a dopant such that said partially sacrificial substrate includes a doped region and an undoped region, wherein the doped region is adjacent the first surface of said partially sacrificial substrate;
etching selected regions of said doped and undoped regions of said partially sacrificial substrate, wherein the remaining doped regions of said partially sacrificial substrate form members of the resulting microelectromechanical device;
providing a support substrate for supporting said partially sacrificial substrate;
forming at least one mesa on a respective surface of said support substrate such that said at least one mesa extends outwardly from the respective surface;
bonding said first surface of said partially sacrificial substrate to said at least one mesa such that the first surface of said partially sacrificial substrate is suspended above the remainder of the respective surface of said support substrate with the doped region of said partially sacrificial substrate in a facing relationship thereto; and
dissolving said undoped region from said partially sacrificial substrate such that at least one of said members of the resulting microelectromechanical device defined by said doped region of said partially sacrificial substrate is moveable in relation to said support substrate.

11. A method according to claim 10 further comprising the step of depositing a conductive material on at least a portion of the surface of said mesa prior to said bonding step to form an electrode that will be disposed in electrical communication with the doped region of said partially sacrificial substrate following said bonding step.

12. A method according to claim 10, wherein said bonding step comprises the step of anodically bonding said doped first surface of said partially sacrificial substrate to said mesa of said support substrate.

13. A method according to claim 10, wherein said forming step comprises the step of forming at least one mesa having a contact surface extending between a set of sloped sidewalls, and wherein said method further comprises the step of depositing a conductive material on at least a portion of the contact surface and at least one of the sloped sidewalls of said mesa of said support substrate to form an electrode thereon prior to said bonding step.

14. A method according to claim 13, wherein said forming step comprises the steps of:
applying a photoresistive layer to said surface of said support substrate at a location corresponding to a predetermined location of said mesa, wherein said photoresistive layer is dimensionally sized to approximate the dimensions of the base of the mesa;
etching the exposed surface of said support substrate;
gradually reducing the dimensional size of the photoresistive layer during said etching step such that the resulting mesa comprises a contact surface extending between a set of sloped sidewalls having dimensions smaller than said base of the mesa.

15. A method according to claim 10 further comprising the step of providing a support substrate formed of a dielectric material.

* * * * *